United States Patent
Brunn et al.

(10) Patent No.: US 10,903,838 B1
(45) Date of Patent: Jan. 26, 2021

(54) INTEGRATED CIRCUIT CLOCK MANAGEMENT DURING LOW POWER OPERATIONS

(71) Applicant: Silicon Laboratories Inc., Austin, TX (US)

(72) Inventors: Brian Taylor Brunn, Austin, TX (US); Paul Ivan Zavalney, Austin, TX (US); Adrianus Josephus Bink, Oslo (NO); Chester Yu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/656,867

(22) Filed: Oct. 18, 2019

(51) Int. Cl.
  *G06F 1/08* (2006.01)
  *G06F 1/324* (2019.01)
  *H03K 19/00* (2006.01)

(52) U.S. Cl.
  CPC .......... *H03K 19/0016* (2013.01); *G06F 1/08* (2013.01); *G06F 1/324* (2013.01)

(58) Field of Classification Search
  CPC ........ G06F 1/08; G06F 1/324; H03K 19/0016
  USPC ....................................................... 327/291
  See application file for complete search history.

(56) References Cited

U.S. PATENT DOCUMENTS

| 5,151,986 A | 9/1992 | Langan et al. |
| 2012/0062197 A1* | 3/2012 | Luders ............ G05F 1/563 323/282 |
| 2015/0381046 A1* | 12/2015 | Chang ............ H02M 3/156 323/271 |

* cited by examiner

*Primary Examiner* — William Hernandez
(74) *Attorney, Agent, or Firm* — Polansky & Associates, P.L.L.C.; Paul J. Polansky

(57) ABSTRACT

An integrated circuit includes a clock management unit that selectively provides a clock signal, an energy management circuit that provides an internal power supply voltage to an internal voltage rail in response to an external power supply voltage, and has a capacitor coupled between the internal voltage rail and a reference voltage terminal, and a clocked digital circuit that is coupled to the internal voltage rail and the reference voltage terminal and operates in synchronism with the clock signal. The clock management unit provides the clock signal at a first frequency during a standby state, continuously at a second frequency higher than the first frequency during an active state, and during a first clock cycle following an end of the standby state while suppressing the clock signal during at least one subsequent clock cycle during a transition state between the standby state and the active state.

25 Claims, 7 Drawing Sheets

US 10,903,838 B1

INTEGRATED CIRCUIT CLOCK MANAGEMENT DURING LOW POWER OPERATIONS

FIELD

The present disclosure relates generally to integrated circuits, and more particularly to clock circuits used in integrated circuits with low power modes.

BACKGROUND

Modern digital integrated circuits use clock signals to time inputs and outputs. For example, these integrated circuits can use a clock signal to latch inputs to a combinatorial logic block, and the same clock signal to latch outputs produced by it. They predominately use complementary metal-oxide-semiconductor (CMOS) technology because it allows operation at high speed with relatively low power. CMOS logic circuits operate at low power because they only draw significant current from the power supply during switching. Because of this characteristic, the power consumption of a CMOS logic circuit is proportional to the frequency of operation.

Large CMOS integrated circuits use "clock trees" to fan out the clock signal around the chip. A clock tree has a "trunk" that receives the clock signal from the oscillator or other clock source, "branches" that receive the output of the trunk and that are routed in different directions on the chip, and sub-branches and/or "leaves" that receive the outputs of the branches and provide the clock signal to further levels of the clock tree and ultimately to the actual circuitry. The clock tree typically re-buffers the clock signals at the trunk and each branch, sub-branch, and leaf. The clock trees use CMOS buffers, typically in the form of inverters, to drive the clock signal over relatively long conductors to their respective destinations, and can itself consume a significant amount of power.

Power consumption in digital CMOS circuits is also proportional to the square of the power supply voltage. Many large CMOS integrated circuits, such as microcontroller units (MCUs) that typically operate on battery power, use on-chip voltage regulators to ensure that the logic circuits receive adequate, but not excessive, power supply voltage levels to operate properly at the chosen frequency while keeping power consumption low.

In addition, many of these CMOS integrated circuits provide low power or standby states in which, during periods of low or no activity, the clock signal can be reduced significantly in frequency or removed from the logic circuits altogether in order to save power. When the operation state changes from standby state to full speed operation, there is a large step change in current consumption because of the sudden switching of many logic gates at high speed. The on-chip voltage regulator must be capable of responding to this large step change in load. The voltage regulators typically use large on-chip capacitors to be able to supply the needed current after a sudden return to operation at high frequencies, but the large capacitors consume a significant amount of integrated circuit area and increase the cost of the chip.

Figure 1:
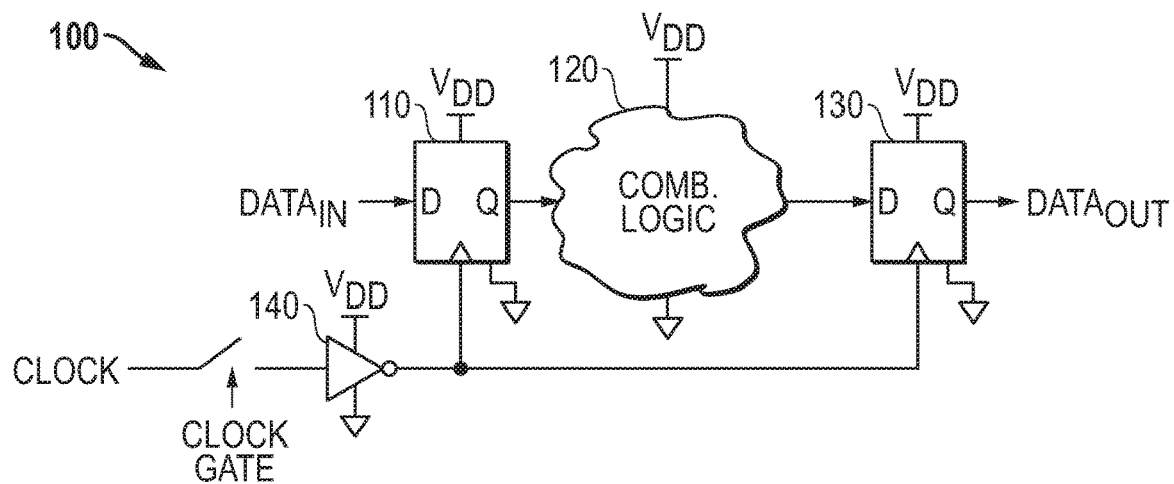
FIG. 1 illustrates in block diagram form a clocked digital logic system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

FIG. 1 illustrates in block diagram form a clocked digital logic system 100 known in the prior art. Clocked digital logic system 100 includes generally a latch 110, a combinatorial logic circuit 120, a latch 130, and a clock buffer 140. Latch 110 is a clocked D flip-flop having a D input for receiving a data signal labeled "$DATA_{IN}$", a clock input, a Q output, a positive power supply terminal connected to a power supply voltage terminal labeled "$V_{DD}$", and a negative power supply terminal connected to ground. Combinatorial logic block 120 has an input connected to the Q output of latch 110, an output, a positive power supply terminal connected to $V_{DD}$, and a negative power supply terminal connected to ground. Latch 130 is also a clocked D flip-flop having a D input connected to the output of combinatorial logic circuit 120, a clock input, a Q output for providing an output signal labeled "$DATA_{OUT}$", a power supply input connected to $V_{DD}$, and a ground input connected to ground. Clock buffer 140 has an input for receiving a clock signal labeled "CLOCK" through a switch controlled by a signal labeled "CLOCK GATE", an inverting output connected to the clock inputs of latches 110 and 130, a positive power supply terminal connected to $V_{DD}$, and a negative power supply terminal connected to ground.

Clocked digital logic system 100 is representative of circuitry used in modern digital logic circuits. For example, latches 110 and 130 may be pipeline latches with combinatorial logic circuit 120 performing the function of a corresponding pipeline state. Latch 110 ensures that the input to combinatorial logic circuit 120 is provided in a stable state in synchronism with the CLOCK signal, and latch 130 ensures that the output of combinatorial logic circuit 120 is captured after it has resolved and is provided in a stable state to a subsequent combinatorial logic block associated with a subsequent pipeline state in synchronism with the CLOCK signal.

When clocked digital logic system 100 is implemented using CMOS circuitry, most power consumption occurs around transitions in the CLOCK signal. For example, a transition in the CLOCK signal can cause switching currents through clock buffer 140, shown in FIG. 1 as an inverter. Likewise, latches 110 and 130 only consume significant power when their transistors switch during clock signal transitions. Combinatorial logic circuit 120 consumes power over a CLOCK period as its inputs propagate to its outputs, and this power consumption will be spread more evenly over the clock period, but will approach zero a setup time before the next transition in the CLOCK signal.

As illustrated in FIG. 1, clocked digital logic system 100 has a low power standby mode. During this low power standby mode, the integrated circuit gates off the CLOCK signal from the input of clock buffer 140 by activating the CLOCK GATE signal. By the gating off of the clock signal, the integrated circuit suppresses almost all of the power consumption of clocked digital logic system 100.

Figure 2:
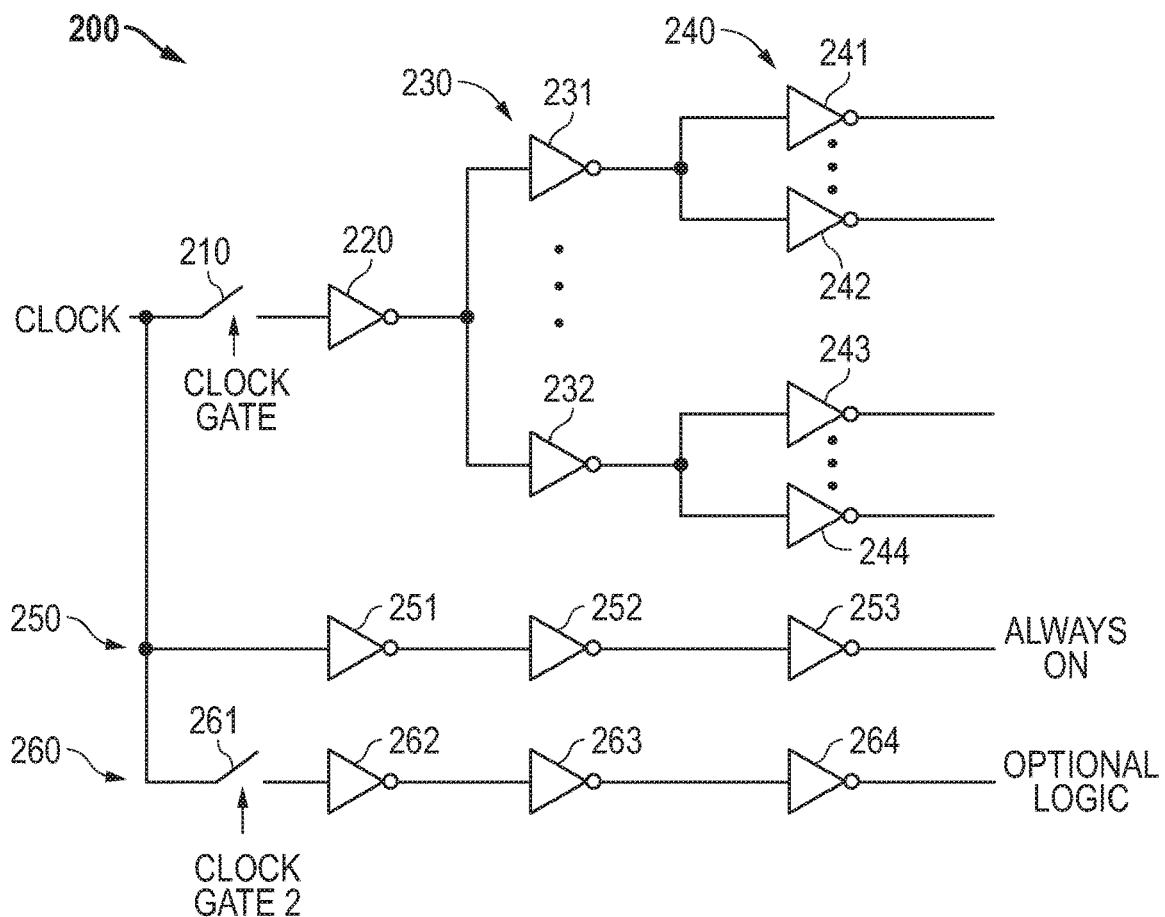
FIG. 2 illustrates in block diagram form a clock tree suitable for distributing a clock signal in an integrated circuit known in the prior art.

FIG. 2 illustrates in block diagram form a clock tree 200 suitable for distributing a clock signal in an integrated circuit known in the prior art. Clock tree 200 includes generally a clock gate 210, an inverter 220 forming a first level of clock tree 200, a set of inverters 230 forming a second level of clock tree 200, and a set of inverters 240 at a third level of clock tree 200. Clock gate 210 has a first terminal for receiving the CLOCK signal, a second terminal, and is opened in response to the CLOCK GATE signal.

Inverter 220 has an input connected to the second terminal of clock gate 210, and an output. Inverter 220 forms the "trunk" of clock tree 200.

Inverters 230 include exemplary inverters 231 and 232. Inverter 231 has an input connected to the output of inverter 220, and an output. Inverter 232 has an input connected to the output of inverter 220, and an output. Inverters 230 forms the "branches" of clock tree 200.

Inverters 240 include exemplary inverters 241, 242, 243, and 244. Inverter 241 has an input connected to the output of inverter 231, and an output. Inverter 242 has an input connected to the output of inverter 231, and an output. Inverter 243 has an input connected to the output of inverter 232, and an output. Inverter 244 has an input connected to the output of inverter 232, and an output. Inverters 230 forms the "leaves" of clock tree 200.

An integrated circuit uses clock tree 200 to distribute the CLOCK signal geographically on the integrated circuit to associated clocked circuitry, such as pipeline latches. In modern integrated circuit design, digital logic circuits are laid out automatically by a tool known as a place and route tool. The place and route tool does not necessarily place all circuits for a given logic block adjacent to each other, thus necessitating a larger clock tree than would be required by a manual layout to fan out the CLOCK signal to all associated circuitry. Clock tree 200 itself consumes a significant amount of power while switching. Exit from the low power state creates a significant step increase in power consumption and current drawn from the power supply system in the clock tree, which may include an on-chip voltage regulator.

FIG. 2 also shows two additional paths that may be present in the clock tree. First, an always-on clock path 250 includes inverters 251, 252, and 253. Inverter 251 has an input for receiving the CLOCK signal, and an output. Inverter 252 has an input connected to the output of inverter 251, and an output. Inverter 253 has an input connected to the output of inverter 252, and an output that provides a clock signal to always-on circuits, such as interrupt circuitry to bring the clocked circuitry out of low power standby mode. Second, a gated clock tree 260 includes a switch 261, and inverters 262, 263, and 264. Switch 261 has a first terminal for receiving the CLOCK signal, and a second terminal, and a control terminal for receiving a signal labeled "CLOCK GATE 2". Inverter 262 has an input connected to the output of switch 261, and an output. Inverter 263 has an input connected to the output of inverter 262, and an output. Inverter 264 has an input connected to the output of inverter 263, and an output for providing a clock signal to optional logic on a separate clock domain from the main clock tree.

Figure 3:
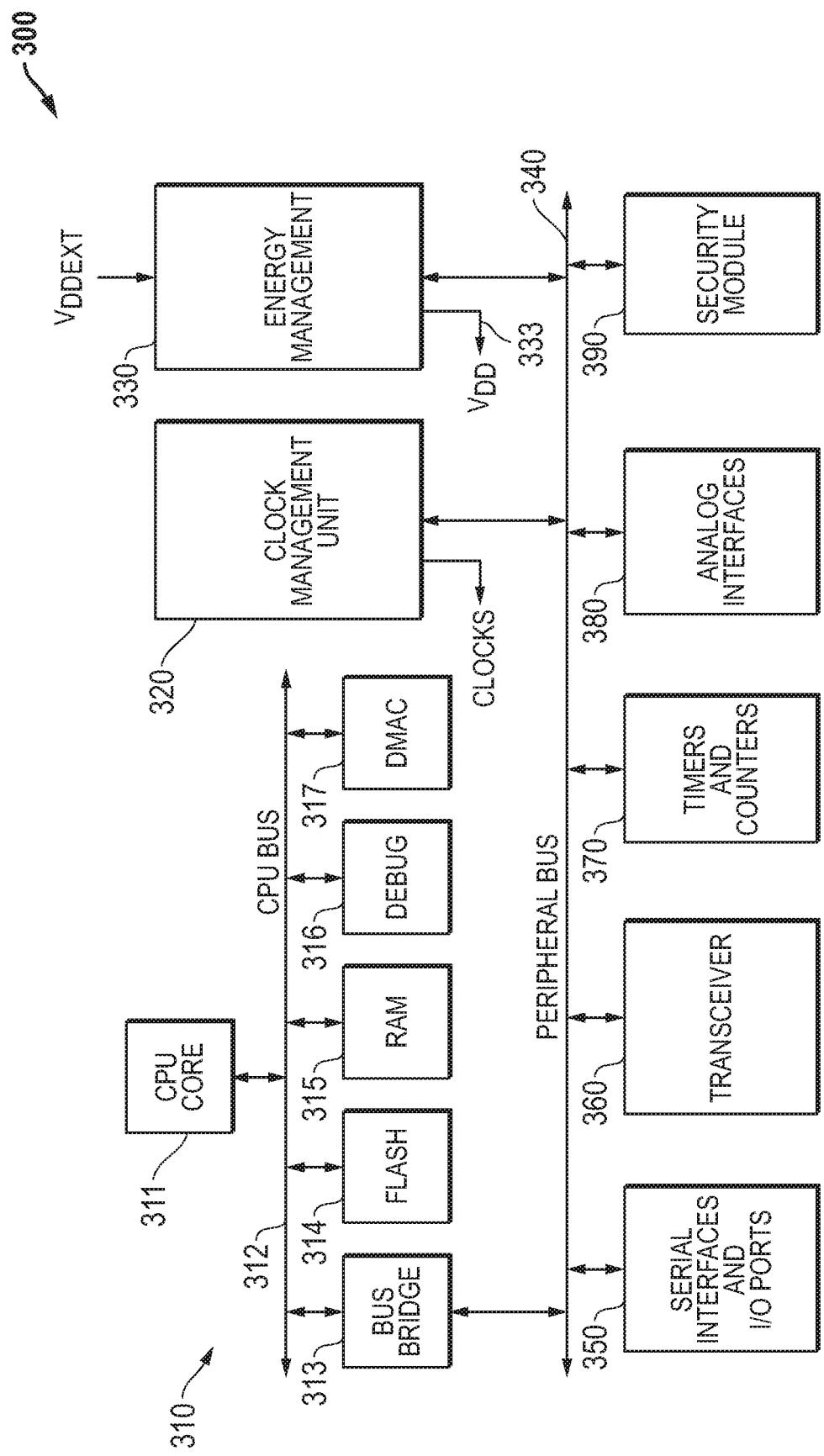
FIG. 3 illustrates in block diagram form an integrated circuit microcontroller unit (MCU) with a clock management unit according to an embodiment of the present disclosure.

FIG. 3 illustrates in block diagram form a microcontroller unit (MCU) 300 with a clock management unit according to an embodiment of the present disclosure. MCU 300 is implemented as a complementary metal-oxide-semiconductor (CMOS) integrated circuit and includes generally a central processing unit (CPU) system 310, clock management unit 320, an energy management circuit 330, a peripheral bus 340, a set of serial interfaces and input/output (I/O) ports 350, a transceiver 360, a set of timers and counters 370, a set of analog interfaces 380, and a security module 390.

CPU system 310 includes a CPU bus 312 interconnecting a CPU core 311, a bus bridge 313, a FLASH memory 314, a random-access memory (RAM) 315, a debug circuit 316, and a direct memory access (DMA) controller (DMAC) 317. CPU system 310 includes a CPU bus 312 separate from peripheral bus 340 to isolate transactions initiated by CPU core 311 to local devices and memory without affecting traffic on peripheral bus 340. Bus bridge 213 is a circuit that allows cross-bus transfers between CPU bus 312 and peripheral bus 340. CPU system 310 provides FLASH memory 314 for non-volatile storage of program code that can be bootstrap loaded from an external source, as well as parameters that need to be preserved when MCU 300 is powered down. RAM 315 provides a working memory for use by CPU core 311. Debug circuit 316 provides program trace capabilities with access to registers on CPU core 311 for software debug. DMAC 317 provides programmable DMA channels to offload CPU core 311 from routine data movement tasks between peripherals and memory.

MCU 300 includes a set of peripherals that make it suitable for a variety of general-purpose embedded applications. Peripheral bus 340 interconnects bus bridge 313, clock management unit 320, energy management circuit 330, serial interfaces and I/O ports 350, transceiver 360, timers and counters 370, analog interfaces 380, and security module 390. The serial interfaces in serial interfaces and I/O ports 350 operate according to a variety of synchronous and asynchronous character-oriented and serial protocols, and the I/O ports are a set of general-purpose input/output circuits and terminals that can be programmed for specific functions or remain available to software for general purpose operation. Transceiver 360 includes various analog and digital circuitry for external radio transmission and reception. Timers and counters 370 provide various programmable timing and event counting functions useful for embedded control, and include a watchdog timer and a real time clock. Analog interfaces 380 include an analog error amplifier and analog-to-digital converter (ADC) for accurate analog input signal measurement. Security module 390 provides an encryption function that is useful for data communication and storage in secure environments.

Generally, MCU 300 integrates CPU system 310 and several peripherals for a wide variety of application environments and is suitable for very low power operation. To facilitate low power operation, MCU 300 includes an energy management circuit 330 that provides several programmable functions to support extremely low power operation. For example, energy management circuit 330 includes a voltage regulator to provide a precise internal power supply voltage that is sufficient for the internal operating speed but low enough in voltage to reduce power consumption. It also includes a brown-out detector designed to force MCU 300 into reset when power consumption is too high, as well as a low-power power on reset circuit.

The voltage regulator in energy management circuit 330 receives an externally provided power supply voltage labeled "$V_{DDEXT}$", and provides well-regulated internal voltage $V_{DD}$ in response. The internal voltage regulator must provide $V_{DD}$ across all changes in load. In particular, the voltage regulator must continue to provide $V_{DD}$ at the desired voltage level, or within suitable range of the desired voltage level, when the operating state changes, such as a transition from a standby state to an active state. The standby state can be, for example, a clock gated state in which the clock signal is gated off, or a low frequency or "keep-alive" state in which the frequency of the clock signal is significantly reduced.

In addition, MCU 300 includes a clock management unit 320 that provides a variety of clocks labeled "CLOCKS" and clock functions that MCU 300 uses to support its low power modes. The CLOCKS are distributed through different clock trees to the digital logic circuits on MCU 300. For example, clock management unit 320 can include a high frequency oscillator based on a crystal reference, as well as lower precision fully integrated resistor-capacitor (RC) oscillators and very low speed RC oscillators that allow standby and/or keep-alive operations.

According to various embodiments disclosed herein, clock management unit 320 provides the CLOCK signal at a first frequency during a STANDBY state. The first frequency can be a relatively low frequency, or zero frequency if the clock signal is gated off. Clock management unit 320 provides the clock signal continuously at a second frequency during an ACTIVE state, in which the second frequency is greater than the first frequency. For example, the second frequency can be 100 MHz. Clock management unit 320 provides the clock signal during a first clock cycle following an end of the STANDBY state and suppresses the clock signal during at least one subsequent clock cycle during a TRANSITION state between the STANDBY state and the ACTIVE state. During the TRANSITION state, the on-chip voltage regulator is stabilizing at a higher output current required by the sudden change in frequency. By suppressing the clock signal during at least one subsequent clock cycle during the TRANSITION state, clock management unit 320 reduces the design requirements on the voltage regulator in energy management circuit 330, while reducing the wake-up latency only minimally, allowing the integrated circuit to meet performance requirements while reducing its size and complexity, and hence cost. These features of MCU 300 will be described in greater detail below.

Figure 4:
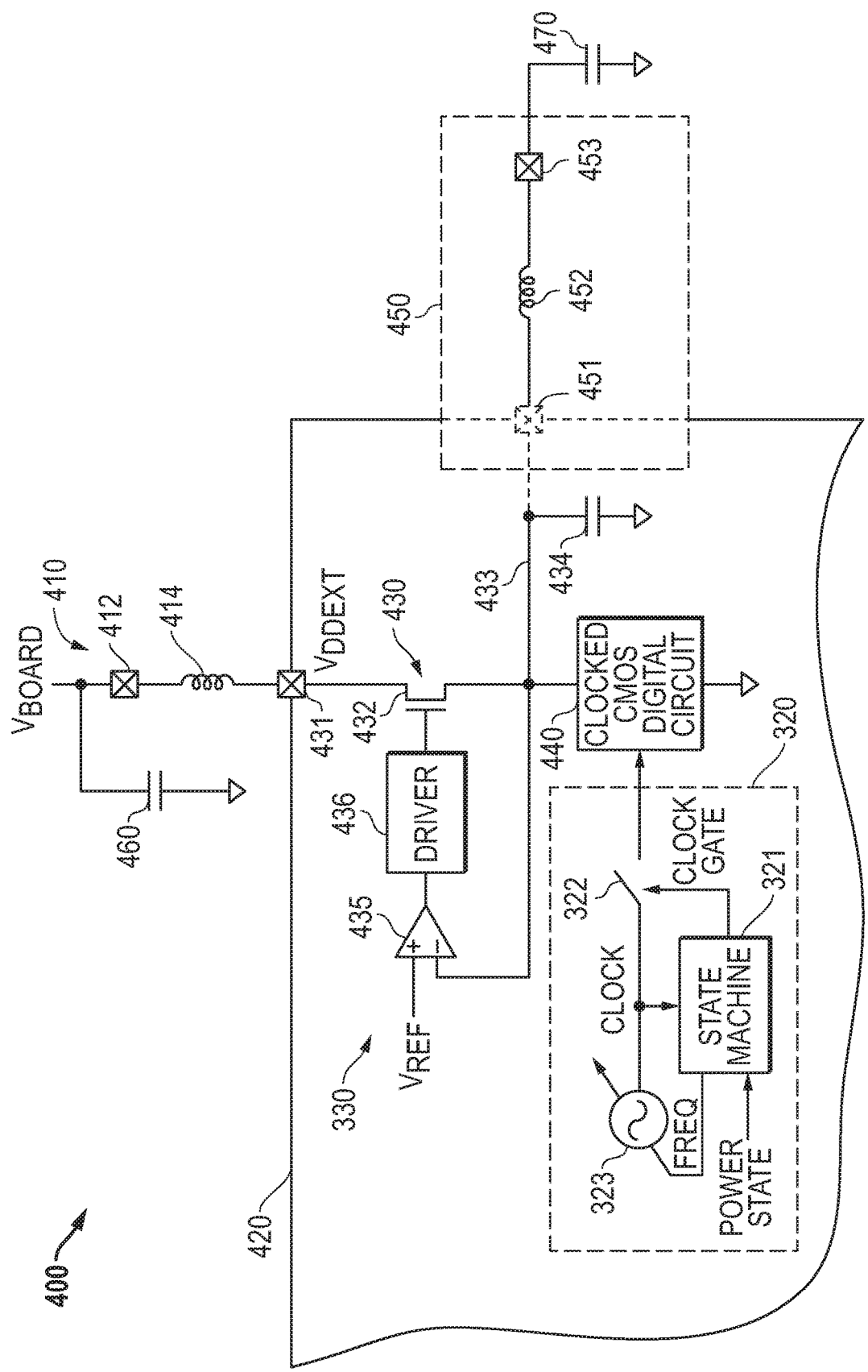
FIG. 4 illustrates in partial block diagram and partial schematic form an MCU system showing a portion of the MCU of FIG. 3 with associated external circuitry.

FIG. 4 illustrates in partial block diagram and partial schematic form an MCU system 400 showing a portion of the MCU 300 of FIG. 3 with associated external circuitry. MCU system 400 includes generally an input power supply routing path 410, an integrated circuit die 420, an optional external capacitor routing path 450, a capacitor 460, and a capacitor 470.

Input power supply routing path 410 includes an integrated circuit package terminal 412 and a parasitic inductor 414. Integrated circuit package terminal 412 receives a board-level power supply voltage labeled "$V_{BOARD}$". It is connected to integrated circuit die 420 through a bond wire having low resistance but an inductance shown as an associated parasitic inductor 414.

Integrated circuit die 420 implements MCU 300 of FIG. 3 and includes generally clock management unit 320, energy management circuit 330, and a clocked CMOS digital circuit 440. In the embodiment shown in FIG. 4, clock management unit 320 includes a state machine 321, a switch 322, and a variable oscillator 323. State machine 321 has an input for receiving the CLOCK signal, an input for receiving a signal labeled "POWER STATE", an output for providing a signal labeled "FREQ", and an output for providing the CLOCK GATE signal. Switch 322 has an input, an output, and a control input for receiving the CLOCK GATE signal. Variable oscillator 323 has an input for receiving the FREQ signal, and an output connected to the input of switch 322 for providing the CLOCK signal.

Energy management circuit 330 includes a voltage regulator 430. Voltage regulator 430 includes a die terminal 431, a transistor 432, an internal voltage rail 433, a capacitor 434, an error amplifier 435, and a driver 436. Die terminal 431 is connected to, and receives power supply voltage $V_{DDEXT}$ from, the second terminal of parasitic inductor 414. Transistor 432 is an N-channel MOS transistor having a drain connected to die terminal 431, a gate, and a source connected to internal voltage rail 433. Error amplifier 435 has a first, non-inverting input for receiving a reference voltage labeled "$V_{REF}$", a second, inverting input connected to internal voltage rail 433, and an output. Driver 436 has an input connected to the output of error amplifier 435, and an output connected to the gate of transistor 432.

Clocked CMOS digital circuit 440 has a positive power supply terminal connected to internal voltage rail 433, a negative power supply terminal connected to ground, and a clock input connected to the second terminal of switch 322. Clocked CMOS digital circuit 440 corresponds to the clocked digital circuitry in MCU 300, and can include, for example, CPU system 310, serial interfaces and I/O ports 350, a part of transceiver 360, timers and counters 370, and security module 390.

Optional external capacitor routing path 450 includes a die terminal 451, a parasitic inductor 452, and an integrated circuit package terminal 453. Die terminal 451 is a bond pad that is connected to internal voltage rail 433. Die terminal 451 is connected to integrated circuit package terminal 453 through a bond wire having low resistance but an inductance shown as an associated parasitic inductor 452.

Capacitor 460 has a first terminal for receiving voltage $V_{BOARD}$, and a second terminal connected to ground. Capacitor 470 is an external capacitor mounted on a printed circuit board (not shown in FIG. 4) and is used to smooth $V_{BOARD}$.

Capacitor 470 has a first terminal connected to integrated circuit package terminal 453, and a second terminal connected to ground. Capacitor 460 is an external capacitor mounted on the printed circuit board and is used to smooth the output of voltage regulator 430.

In operation, clock management unit 320 and energy management circuit 330 work together to provide clocking and internal power supply voltage levels for proper operation of integrated circuit die with low power consumption. Voltage regulator 430 is a low dropout (LDO) voltage regulator. It sets the voltage on internal voltage rail 433 to equal $V_{REF}$. If the voltage on internal voltage rail 433 falls below $V_{REF}$, then error amplifier 435 increases its output voltage. Driver 436 drives the increased output voltage on the gate of transistor 432 to increase its conductivity until the voltage on internal voltage rail 433 rises to $V_{REF}$. If the voltage on internal voltage rail 433 rises above $V_{REF}$, then error amplifier 435 decreases its output voltage. Driver 436 drives the decreased output voltage on the gate of transistor 432 to decrease its conductivity until the voltage on internal voltage rail 433 falls to $V_{REF}$.

Capacitor 434 stores charge that can be used to provide additional charge to the load, e.g. clocked CMOS digital circuit 440, when a sudden increase in the load occurs. Since the connection path to $V_{BOARD}$ includes an inductive bond wire shown as parasitic inductor 414, it will resist a sudden change in current due to the increase in load and $V_{DDEXT}$ will tend to fall or droop. The size of capacitor 434 affects the latency of voltage regulator 430 in response to a step change in load. As capacitor 434 increases in size, it can supply more charge in response to load changes, but also reduces the bandwidth of the LDO control loop. Capacitor 434 is an integrated capacitor, and consumes a large area on the chip, significantly affecting chip cost.

The effective capacitance on internal voltage rail 433 can also be increased by adding optional external capacitor 470. This capability, however, requires an extra die terminal 451 and increases the cost of integrated circuit die 420.

Clock management unit 320 supports two power states. First in an ACTIVE state, state machine 321 deactivates the CLOCK GATE signal to keep switch 322 closed and to provide the CLOCK signal to clocked CMOS digital circuit 440. Second in a STANDBY state, state machine 321 activates the CLOCK GATE signal to open switch 322 and prevent the CLOCK signal from reaching clocked CMOS digital circuit 440 from receiving the clock signal and reducing the frequency of the clocking signal to zero. In STANDBY state, therefore, power consumption is limited to the power consumed by oscillator 323 and any leakage power in clocked CMOS digital circuit 440.

In another embodiment, state machine 321 can support various clock frequencies in the active state based on the workload of the chip. In that case, state machine 321 can also change voltage $V_{REF}$ so that the power supply voltage is set to a voltage sufficient for operation at that frequency.

In yet another embodiment, state machine 321 can operate in the standby state by reducing the frequency of the CLOCK signal to a low, keep-alive frequency. In this embodiment, state machine 321 would not activate the CLOCK GATE signal, but would rather set the FREQ signal to reduce the frequency of the CLOCK signal to the low keep-alive frequency. In this example, the frequency of the CLOCK signal in STANDBY state could be greater than zero Hz but less than the normal operation frequency by a significant amount, such as by at least two orders of magnitude. For example, the frequency during ACTIVE state could be 100 MHz, but the frequency in standby state could be reduced to 1 MHz.

In still another embodiment, these two mechanisms could be used together either to gate off the CLOCK signal from clocked digital CMOS circuit 440, or to reduce the frequency of the CLOCK signal by a significant amount. In this way, even the power consumed by the oscillator can be reduced. However, depending on its design, oscillator 323 may need a stabilization period, making the low-frequency option less appealing because it would further add to latency when changing from standby mode to active mode.

As will be described further below, clock management unit 320 supports a TRANSITION state that is entered between the STANDBY state and the ACTIVE state as noted above, that can be used to reduce the design requirements of voltage regulator 430 and hence chip cost.

Figure 5:
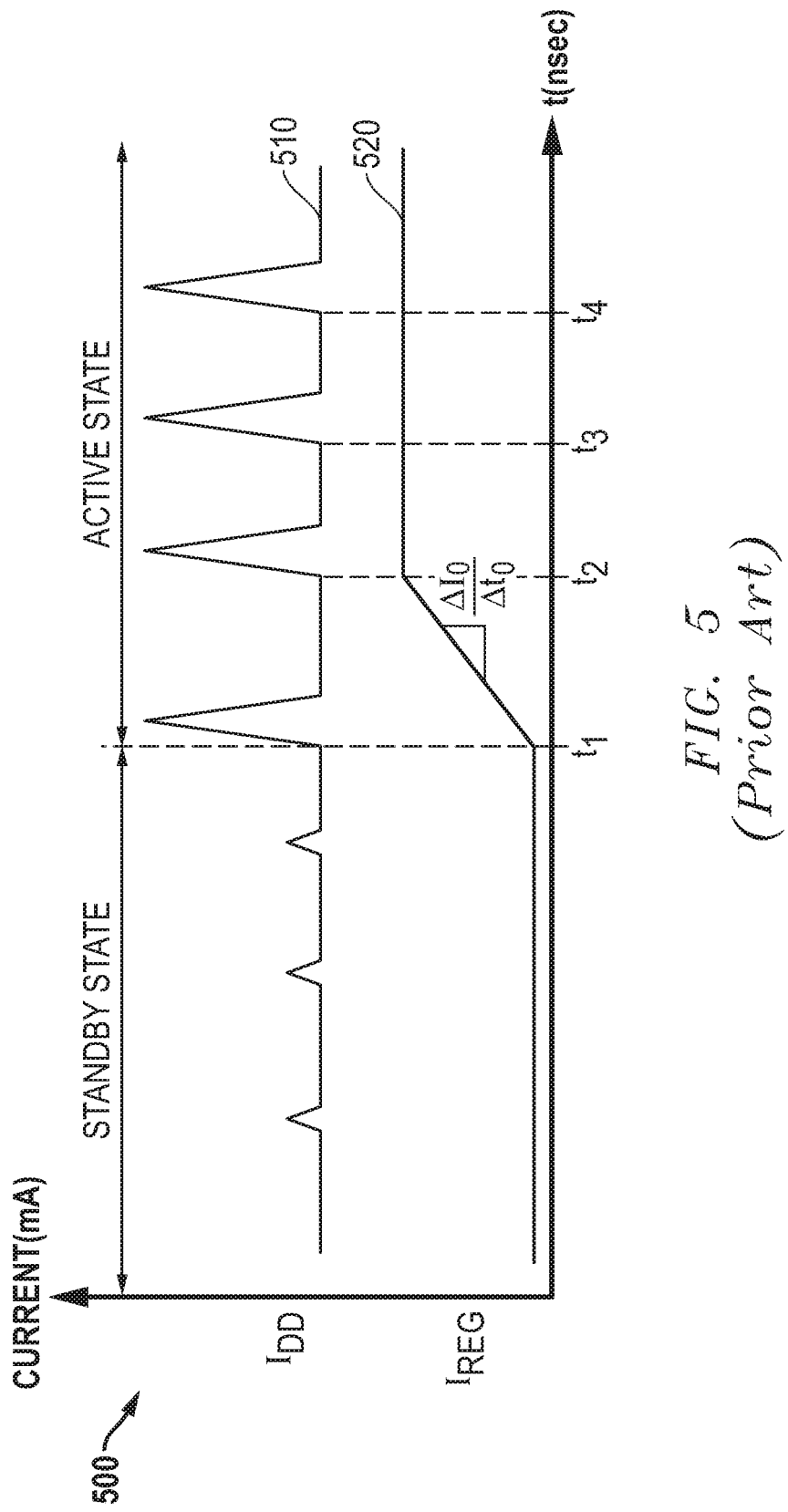
FIG. 5 illustrates a timing diagram showing the operation of an integrated circuit during a power state transition known in the prior art.

FIG. 5 illustrates a timing diagram 500 showing the operation of an integrated circuit during a power state transition known in the prior art. In timing diagram 500, the horizontal axis represents time in nanoseconds (ns), and the vertical axis current in milliamperes (mA). Timing diagram shows two waveforms of interest, including a first waveform 510 showing power supply to ground current labeled "$I_{DD}$", and a waveform 520 showing current supplied by voltage regulator 430 labeled "$I_{REG}$". Timing diagram 500 shows four time points of interest, labeled "$t_1$", "$t_2$" "$t_3$", and "$t_4$".

As shown in timing diagram 500, before $t_1$, state machine 321 is in a standby state. Oscillator 323 is operational and generates continuous CLOCK pulses, but state machine 321 activates the CLOCK GATE signal to gate off the CLOCK signal from clocked CMOS digital circuit 440. $I_{DD}$ only exhibits small peaks around transitions in the CLOCK signal, such as caused by the oscillator, clock tree, always-on circuits, and/or other separately clock-gated logic, and $I_{REG}$ is stable at a low value.

Shortly before $t_1$, state machine 321 receives a POWER STATE input directing it to enter the active state. State machine 321 deactivates the CLOCK GATE signal, closing switch 322 and causing the CLOCK signal to be provided to clocked CMOS digital circuit 440. Around each clock transition, $I_{DD}$ increases by a relatively large amount, before falling back to a baseline amount. In order to avoid a dip in $V_{DD}$ that would cause circuit failure, the on-chip capacitor connected to the output of the voltage regulator must be able to supply enough current until the LDO regulator adjusts to the higher load current. This ramping in current therefore must take place before the next clock cycle, i.e. by $t_2$, and is represented by a slew rate equal to $\Delta I_0/\Delta t_0$, in which $\Delta I_0$ is the change in the amount of average current, and $\Delta t_0$ is one clock period.

The slew rate $\Delta I_0/\Delta t_0$ determines the size of capacitor 434 (or the capacitance of the parallel capacitors 434 and 470 when the external capacitor option is used), and the bandwidth of the LDO. Thus, there is a tradeoff between maximum clock speed and die size due to the required size of capacitor 434 to respond to sudden step changes in load.

In accordance with the disclosed embodiments, however, integrated circuit die 420 eases the tradeoff with only a small increase in latency, which is usually tolerable. Clock management unit 320 adds a transition state between the standby state and the active state. During the standby state, clock management unit 320 provides the CLOCK signal during a first clock cycle following an end of the standby state and suppresses the clock signal during at least one subsequent clock cycle during the transition state and before entry into the active state. The transition state extends the period for the on-chip voltage regulator to stabilize at a higher output current required by the sudden change in frequency. By suppressing the clock signal during at least one subsequent clock cycle during the transition state, clock management unit 320 reduces the design requirements on voltage regulator 430 in energy management circuit 330 while reducing the wake-up latency only minimally, allowing the integrated circuit to meet performance requirements while reducing its size and complexity, and hence cost.

Figure 6:
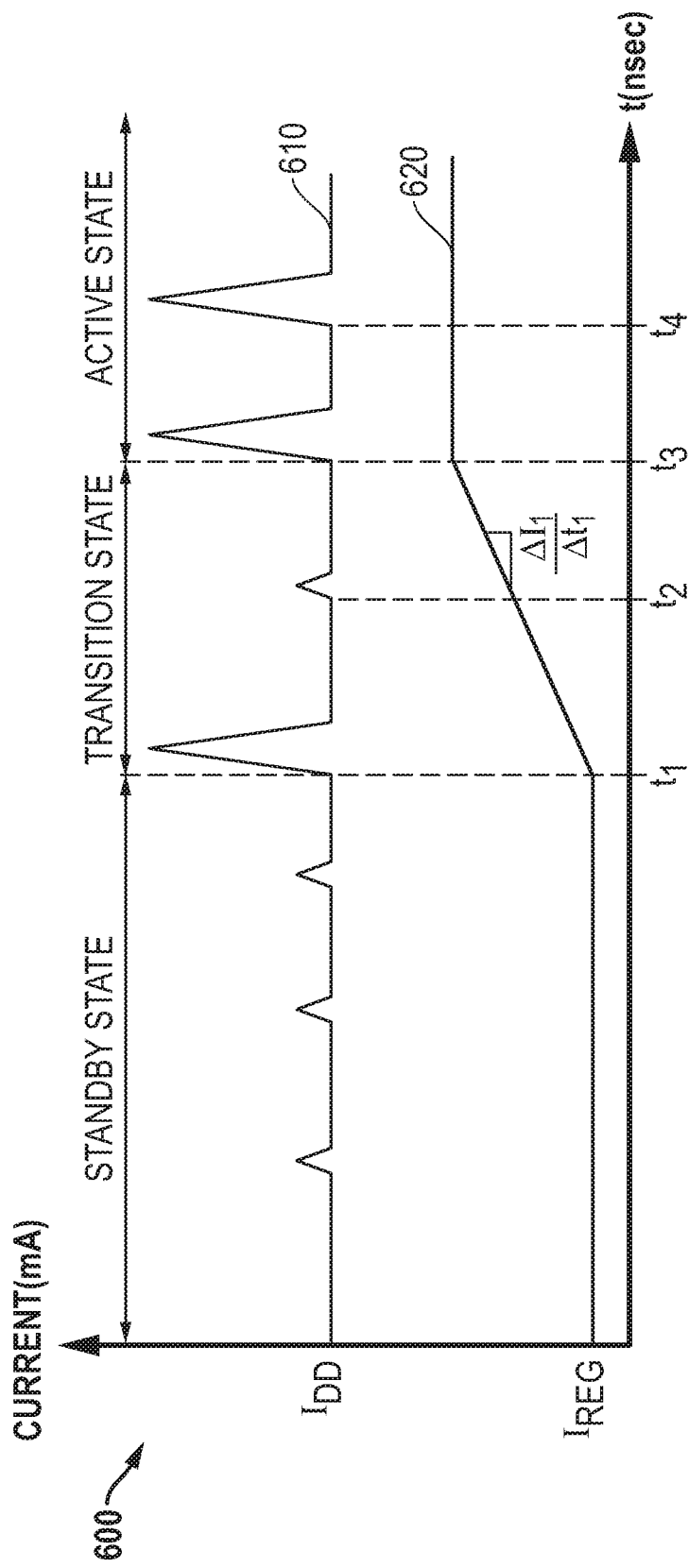
FIG. 6 illustrates a timing diagram showing the operation of the integrated circuit MCU of FIG. 3 during a power state transition according to a first particular embodiment of the present disclosure.

FIG. 6 illustrates a timing diagram 600 showing the operation of integrated circuit MCU 300 of FIG. 3 during a power state transition according to a first particular embodiment of the present disclosure. In timing diagram 600, the horizontal axis represents time in ns, and the vertical axis current in mA. Timing diagram 600 shows two waveforms of interest, including a waveform 610 showing $I_{DD}$, and a waveform 620 showing $I_{REG}$. Timing diagram 600 again shows four time points of interest, similarly labeled "$t_1$", "$t_2$" "$t_3$", and "$t_4$".

As shown in timing diagram 600, before $t_1$, state machine 321 is in the standby state. Oscillator 323 is operational and generates continuous CLOCK pulses, but state machine 321 provides the CLOCK GATE signal in an active state, gating off the CLOCK signal from clocked CMOS digital circuit 440. $I_{DD}$ only exhibits small peaks around transitions in the CLOCK signal, such as caused by the oscillator, the clock tree, and always-on circuits, and $I_{REG}$ is stable at a low value.

Shortly before $t_1$, state machine 321 receives a POWER STATE input directing it to enter the active state. State machine 321 first enters the TRANSITION state, in which it provides the CLOCK signal during a first clock cycle following an end of the STANDBY state, i.e. between $t_1$ and $t_2$, but suppresses the CLOCK signal, e.g., by activating the CLOCK GATE signal, during at least one subsequent clock cycle. In this example, state machine 321 suppresses the CLOCK signal during one clock cycle between times $t_2$ and $t_3$. After $t_3$, LDO regulator 430 has increased the average current by $\Delta I_1$, which is the same as $\Delta I_0$, but over a period $\Delta t_1$ equal to twice period $\Delta t_0$. Thus, the slew rate $\Delta I_0/\Delta t_0$ associated with known designs can be cut in half, with the cost of only one extra CLOCK cycle in performance. This additional latency is believed to be acceptable in most systems, but the size of both voltage regulator 430 and capacitor 434 can be significantly reduced.

As noted above, during the transition state, clock management unit 320 provides the CLOCK signal during a first clock cycle following an end of the STANDBY and suppresses the CLOCK signal during at least one subsequent clock cycle. Timing diagram 600 shows the example in which clock management unit 320 suppresses the CLOCK signal during exactly one clock cycle following one clock cycle in which it provided the CLOCK signal during the transition state. However other patterns are possible to reduce the requirements on voltage regulator 430 and capacitor 434, and another such example will now be shown.

Figure 7:
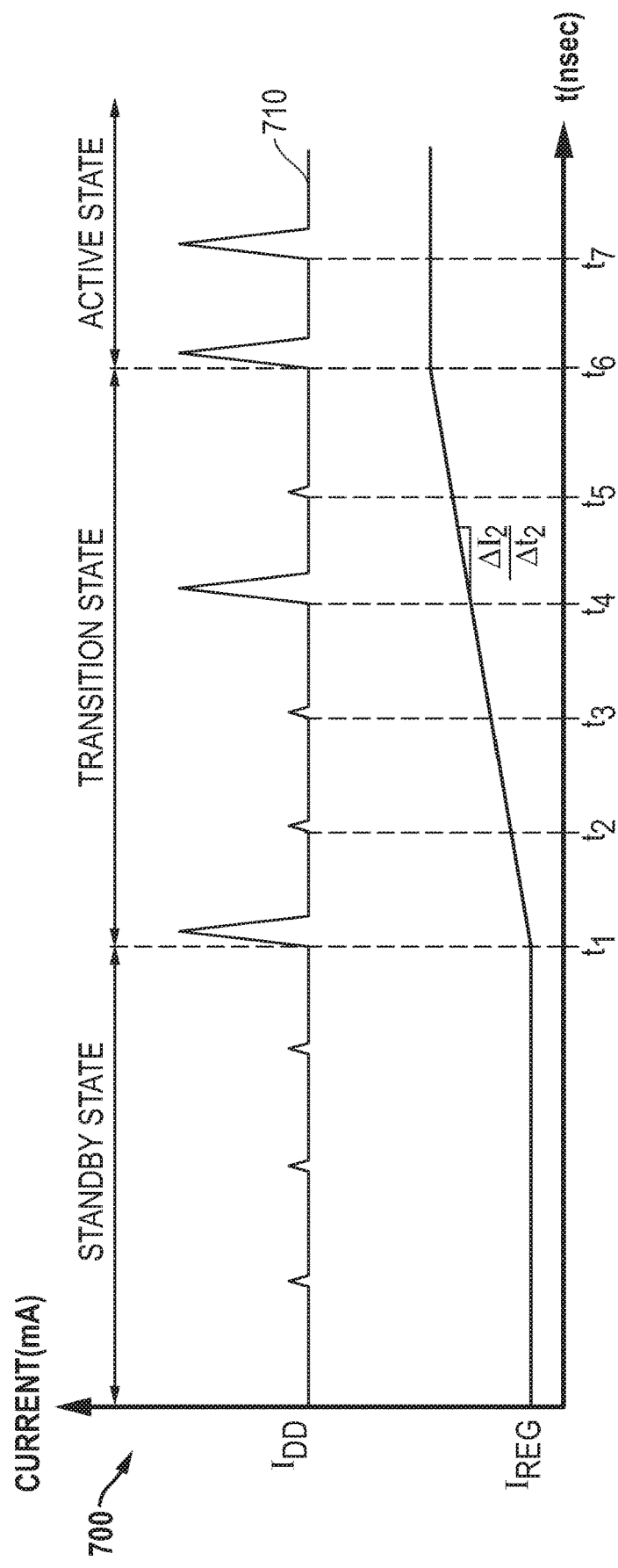
FIG. 7 illustrates a timing diagram showing the operation of the integrated circuit MCU of FIG. 3 during a power state transition according to a second particular embodiment of the present disclosure.

FIG. 7 illustrates a timing diagram 700 showing the operation of integrated circuit MCU 300 of FIG. 3 during a power state transition according to a second particular embodiment of the present disclosure. In timing diagram 700, the horizontal axis represents time in ns, and the vertical axis current in mA. It shows two waveforms of interest, including a first waveform 710 showing $I_{DD}$, and a waveform 720 showing $I_{REG}$. Timing diagram 700 shows seven time points of interest, labeled "$t_1$" through "$t_7$".

As in timing diagrams 500 and 600, before $t_1$, state machine 321 is in the STANDBY state. Oscillator 323 is operational and generates continuous CLOCK pulses, but state machine 321 activates the CLOCK GATE signal to gate off the CLOCK signal from clocked CMOS digital circuit 440. $I_{DD}$ only exhibits small peaks around transitions in the CLOCK signal, such as caused by the oscillator itself, the clock tree, and always-on circuits, and $I_{REG}$ is stable at a low value.

Shortly before $t_1$, state machine 321 receives a POWER STATE input directing it to enter the ACTIVE state. State machine 321 first enters the TRANSITION state, in which it provides the CLOCK signal during a first clock cycle following an end of the STANDBY state, i.e. between $t_1$ and $t_2$, but again suppresses the CLOCK signal following $t_1$. As shown in timing diagram 700, however, state machine 321 suppresses the CLOCK signal for two clock cycles, between $t_2$ and $t_3$ and between $t_3$ and $t_4$. State machine 321 provides the CLOCK signal again during the fourth clock cycle, e.g., $t_4$ to $t_5$, but again suppresses it during the next clock cycle, e.g. between $t_5$ and $t_6$. Starting at $t_6$, state machine 321 enters the ACTIVE state and provides the CLOCK signal continuously thereafter while it remains in the ACTIVE state.

After $t_6$, LDO regulator 430 has increased the average current by $\Delta I_2$, which is the same as $\Delta I_0$, but over a period $\Delta t_2$ equal to five times period $\Delta t_0$. Thus, the slew rate $\Delta I_2/\Delta t$ associated with known designs can be cut to one-fifth, with the cost of only three extra CLOCK cycles in performance. In many if not most systems, this additional latency is believed to be acceptable, but the size of both regulator 430 and capacitor 434 can be further reduced.

This technique can be extended further, until the decrease in performance outweighs the reduction in integrated circuit size and cost. In general, it can be extended to embodiments in which the pulse density of the CLOCK signal pulses increases over the TRANSITION state.

Figure 8:
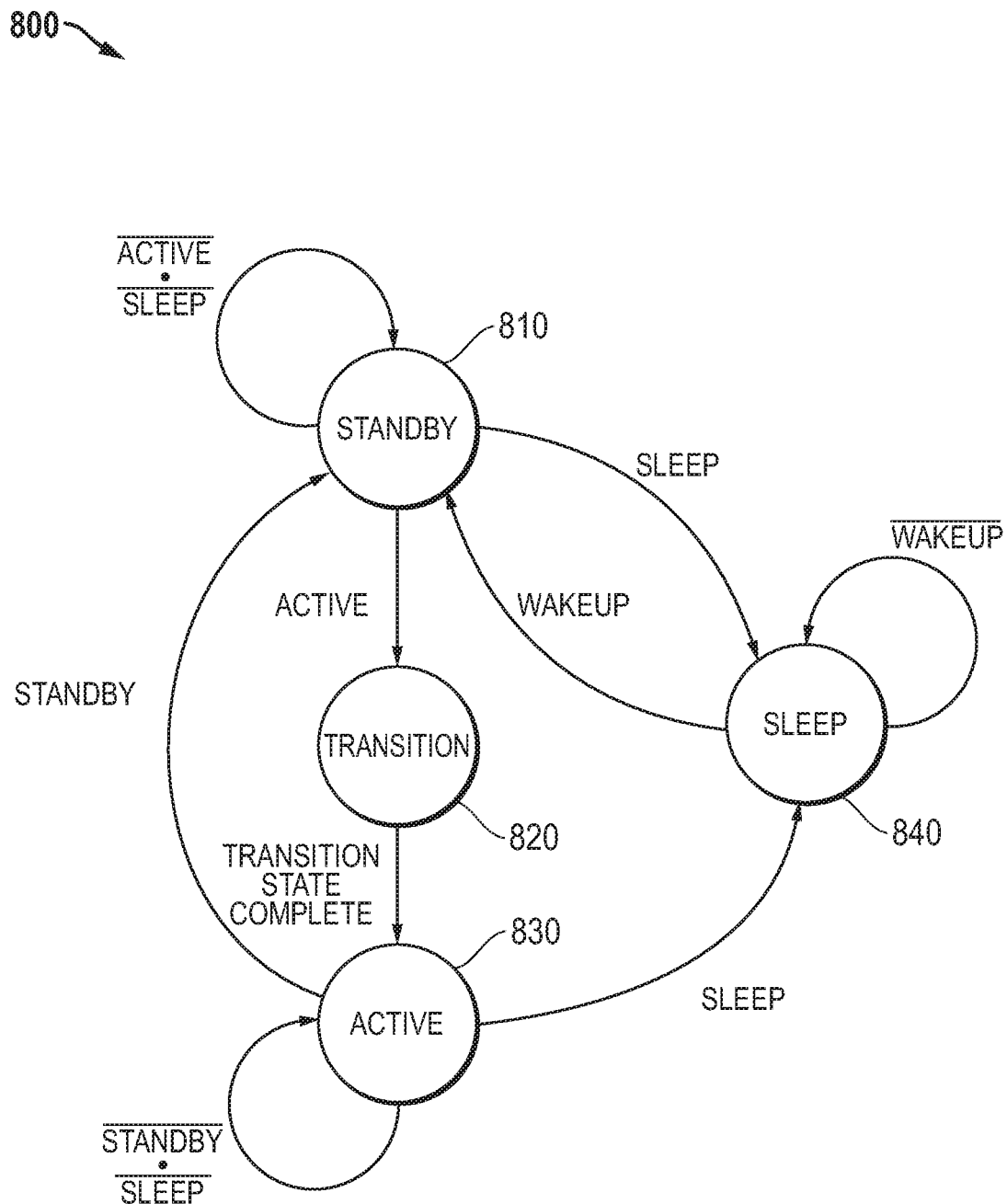
FIG. 8 illustrates a state diagram of the clock management unit of the integrated circuit MCU of FIG. 3.

FIG. 8 illustrates a state diagram 800 of clock management unit 320 of integrated circuit MCU 300 of FIG. 3. State diagram 800 has four states, the STANDBY state 810, a TRANSITION state 820, an ACTIVE state 830, and a SLEEP state 840. Clock management unit 320 remains in STANDBY state 810 until it receives either an ACTIVE signal or a SLEEP signal, but remains in STANDBY state 810 while there is no ACTIVE state request and there is no SLEEP state request ($\overline{\text{ACTIVE·SLEEP}}$). In response to an ACTIVE state request, state machine 321 enters the TRANSITION state. The TRANSITION state is a temporary state, and state machine 321 automatically transitions to the ACTIVE state 830 after it performs the TRANSITION state sequence. State machine 321 then stays in the ACTIVE state while there is no STANDBY state request and there is no SLEEP state request ($\overline{\text{STANDBY·SLEEP}}$). In response to a STANDBY state request, state machine transitions back to STANDBY state 810. In response to a SLEEP state request, state machine 321 transitions to SLEEP state 840. It remains in SLEEP state 840 until there is a wakeup request ($\overline{\text{WAKEUP}}$), such as an external interrupt. In SLEEP state 840, clock management unit 320 and energy management circuit 330 together perform further power reduction operations, such as stopping the oscillator, removing power from clocked CMOS digital circuit 440 to stop leakage power, or other similar measures. In response to a wakeup request, state machine 321 leaves SLEEP state 840 and enters STANDBY state 810.

It should be apparent that state diagram 800 represents just one possible state machine that can be used to implement the TRANSITION state mechanism described herein, and additional or different power states are possible.

Thus, in one form, an integrated circuit has been described that includes a clock management unit, an energy management unit, and a clocked digital circuit. The clock management unit selectively provides a clock signal. The energy management circuit provides an internal power supply voltage to an internal voltage rail in response to an external power supply voltage, and has a capacitor coupled between the internal voltage rail and a reference voltage terminal. The clocked digital circuit is coupled to the internal voltage rail and the reference voltage terminal and operates in synchronism with the clock signal. The clock management unit provides the clock signal at a first frequency during a standby state, provides the clock signal continuously at a second frequency during an active state, wherein the second frequency is greater than the first frequency, and provides the clock signal during a first clock cycle following an end of the standby state and suppresses the clock signal during at least one subsequent clock cycle during a transition state between the standby state and the active state.

The above-disclosed subject matter is to be considered illustrative, and not restrictive, and the appended claims are intended to cover all such modifications, enhancements, and other embodiments that fall within the true scope of the claims. For example in the STANDBY state, the MCU can gate off the CLOCK signal, or reduce its frequency by a significant amount, such as two orders in magnitude. The TRANSITION state can also take various forms, such as the CLOCK signal being provided during a first clock cycle and suppressed during the second clock cycle, being provided during first and a fourth clock cycles and suppressed during second and third clock cycles. Moreover, the TRANSITION state can gradually increase the pulse density of the CLOCK signal pulses increases over a longer TRANSITION state. The power states described herein are only exemplary, and the technique described herein can be used in conjunction with other power states such as a SLEEP state. While the exemplary integrated circuit was an MCU, the technique described herein can be used with other types of clock digital logic circuits.

Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit, comprising:
   a clock management unit for selectively providing a clock signal;
   an energy management circuit for providing an internal power supply voltage to an internal voltage rail in response to an external power supply voltage, and having a capacitor coupled between said internal voltage rail and a reference voltage terminal; and
   a clocked digital circuit coupled to said internal voltage rail and said reference voltage terminal and operating in synchronism with said clock signal,
   wherein said clock management unit:
      provides said clock signal at a first frequency during a standby state;
      provides said clock signal continuously at a second frequency during an active state, wherein said second frequency is greater than said first frequency; and
      provides said clock signal during a first clock cycle following an end of said standby state and suppresses said clock signal during at least one subsequent clock cycle during a transition state between said standby state and said active state.

2. The integrated circuit of claim 1, wherein said transition state comprises two clock cycles.

3. The integrated circuit of claim 2, wherein said transition state comprises five clock cycles, wherein said clock management unit:
   provides said clock signal during said first clock cycle and a fourth clock cycle of said transition state; and
   suppresses said clock signal during second, third, and fifth clock cycles of said transition state.

4. The integrated circuit of claim 1, wherein said clocked digital circuit comprises a complementary metal-oxide-semiconductor (CMOS) digital circuit.

5. The integrated circuit of claim 1, wherein said energy management circuit comprises a low dropout regulator comprising:
   a transistor having a drain for receiving said external power supply voltage, a gate, and a source coupled to said internal voltage rail; and
   an error amplifier having a first input for receiving a reference voltage, a second input coupled to said internal voltage rail, and an output coupled to said gate of said transistor.

6. The integrated circuit of claim 5, further comprising a semiconductor die having:
   a first die terminal coupled to drain of said transistor for receiving said external power supply voltage; and
   a first package terminal coupled to said first die terminal through a corresponding bond wire.

7. The integrated circuit of claim 6, wherein said semiconductor die further comprises:
   a second die terminal coupled to said internal voltage rail; and
   a second package terminal coupled to said second die terminal through a corresponding bond wire.

8. The integrated circuit of claim 1, wherein said first frequency is zero hertz.

9. The integrated circuit of claim 1, wherein said first frequency is greater than zero hertz but less than said second frequency by at least two orders of magnitude.

10. An integrated circuit, comprising:
    an external power supply voltage terminal;
    a voltage regulator having an input coupled to said external power supply voltage terminal, and an output coupled to an internal voltage rail;
    a capacitor coupled between said internal voltage rail and a reference voltage terminal;
    a clocked digital circuit coupled to said internal voltage rail and said reference voltage terminal and having an input for receiving a clock signal; and
    a clock management unit having an output for providing said clock signal, wherein said clock management unit:
       provides said clock signal at a first frequency during a standby state;
       provides said clock signal continuously at a second frequency during an active state, wherein said second frequency is greater than said first frequency; and
       provides said clock signal during a first clock cycle following an end of said standby state and suppresses said clock signal during at least one subsequent clock cycle during a transition state between said standby state and said active state.

11. The integrated circuit of claim 10, wherein said transition state comprises two clock cycles.

12. The integrated circuit of claim 10, wherein said transition state comprises five clock cycles, wherein said clock management unit:
    provides said clock signal during said first clock cycle and a fourth clock cycle of said transition state; and
    suppresses said clock signal during second, third, and fifth clock cycles of said transition state.

13. The integrated circuit of claim 10, wherein said clocked digital circuit comprises a complementary metal-oxide-semiconductor (CMOS) digital circuit.

14. The integrated circuit of claim 10, wherein said voltage regulator comprises a low dropout regulator comprising:

a transistor having a drain coupled to said external power supply voltage terminal, a gate, and a source coupled to said internal voltage rail; and an error amplifier having a first terminal for receiving a reference voltage, a second input coupled to said internal voltage rail, and an output coupled to said gate of said transistor.

15. The integrated circuit of claim 10, wherein said clocked digital circuit comprises a central processing unit core, and the integrated circuit comprises a microcontroller.

16. The integrated circuit of claim 10, wherein said first frequency is zero hertz.

17. The integrated circuit of claim 10, wherein said first frequency is greater than zero hertz but less than said second frequency by at least two orders of magnitude.

18. A method of powering an integrated circuit, comprising:

providing an internal power supply voltage to an internal voltage rail in response to an external power supply voltage;

storing energy in said internal voltage rail with a capacitor coupled between said internal voltage rail and a reference voltage terminal; and selectively clocking a digital circuit coupled to said internal voltage rail and said reference voltage terminal in synchronism with a clock signal, wherein said selectively clocking comprises:

providing said clock signal at a first frequency during a standby state;

providing said clock signal continuously at a second frequency during an active state, wherein said second frequency is greater than said first frequency; and providing said clock signal during a first clock cycle following an end of said standby state and suppressing said clock signal during at least one subsequent clock cycle during a transition state between said standby state and said active state.

19. The method of claim 18, wherein said transition state comprises two clock cycles.

20. The method of claim 19, wherein said transition state comprises five clock cycles, further comprising:

providing said clock signal during said first clock cycle and a fourth clock cycle of said transition state; and suppressing said clock signal during second, third, and fifth clock cycles of said transition state.

21. The method of claim 18, wherein selectively clocking said digital circuit comprises selectively clocking a complementary metal-oxide-semiconductor (CMOS) digital circuit.

22. The method of claim 18, wherein providing said internal power supply voltage to said internal voltage rail in response to said external power supply voltage comprises regulating said external power supply voltage to a desired voltage.

23. The method of claim 22, wherein regulating said external power supply voltage to said desired voltage comprises regulating said external power supply voltage using a low dropout regulator.

24. The method of claim 18, wherein providing said clock signal at said first frequency during said standby state comprises providing said clock signal at zero hertz during said standby state.

25. The method of claim 18, wherein providing said clock signal at said first frequency during said standby state comprises providing said clock signal at a frequency greater than zero hertz but less than said second frequency by at least two orders of magnitude during said standby state.

\* \* \* \* \*